(12) United States Patent
Feng et al.

(10) Patent No.: US 9,882,587 B2
(45) Date of Patent: Jan. 30, 2018

(54) MULTI-BAND POWER AMPLIFIER

(71) Applicant: SKYWORKS SOLUTIONS, INC., Woburn, MA (US)

(72) Inventors: Jinghang Feng, Santa Clara, CA (US); Shuqi Zheng, San Jose, CA (US); Netsanet Gebeyehu, San Jose, CA (US); Ying Shi, Saratoga, CA (US); James Phillip Young, Cedar Rapids, IA (US)

(73) Assignee: Skyworks Solutions, Inc., Woburn, MA (US)

( * ) Notice: Subject to any disclaimer, the term of this patent is extended or adjusted under 35 U.S.C. 154(b) by 0 days.

(21) Appl. No.: 15/085,868

(22) Filed: Mar. 30, 2016

(65) Prior Publication Data
US 2016/0294333 A1 Oct. 6, 2016

Related U.S. Application Data

(60) Provisional application No. 62/140,925, filed on Mar. 31, 2015.

(51) Int. Cl.
*H04M 1/00* (2006.01)
*H04B 1/00* (2006.01)
(Continued)

(52) U.S. Cl.
CPC ........... *H04B 1/0067* (2013.01); *H03F 1/565* (2013.01); *H03F 3/191* (2013.01); *H03F 3/217* (2013.01);
(Continued)

(58) Field of Classification Search
CPC ... H03F 1/26; H03F 3/005; H03F 3/19; H03F 3/217; H03F 3/2176; H03B 1/0067; H03W 88/06
(Continued)

(56) References Cited

U.S. PATENT DOCUMENTS 5,095,285 A 3/1992 Khatibzadeh
5,229,732 A 7/1993 Furutani et al.
(Continued)

FOREIGN PATENT DOCUMENTS

CN 103178790 A 6/2013
JP 1997-18255 A 1/1997
(Continued)

OTHER PUBLICATIONS

Jongchan Kang et al., "A highly linear and efficient differential CMOS power amplifier with harmonic control," IEEE Journal of Solid-State Circuits, vol. 41, No. 6, pp. 1314-1322. Jun. 2006.
(Continued)

*Primary Examiner* — Sanh Phu
(74) *Attorney, Agent, or Firm* — Chang & Hale LLP

(57) ABSTRACT

Systems, devices and methods related to multi-band power amplifier. In some embodiments, a power amplifier module includes a power amplifier having an output stage and configured to receive a signal. The power amplifier module also includes a first programmable harmonic termination circuit in electrical communication with the output stage of the power amplifier. The first programmable harmonic termination circuit includes a first plurality of capacitors and a first plurality of switches, with at least one of the first plurality of capacitors being in electrical communication with at least one of the first plurality of switches. The power amplifier module further includes a controller configured to modify a configuration of the first plurality of switches of the first programmable harmonic termination circuit based at least in part on a second harmonic frequency of the signal.

20 Claims, 10 Drawing Sheets

(51) Int. Cl.
*H03F 3/217* (2006.01)
*H03F 3/191* (2006.01)
*H03F 3/24* (2006.01)
*H03F 3/72* (2006.01)
*H03F 1/56* (2006.01)

(52) U.S. Cl.
CPC ........... *H03F 3/2176* (2013.01); *H03F 3/245* (2013.01); *H03F 3/72* (2013.01); *H03F 2200/111* (2013.01); *H03F 2200/171* (2013.01); *H03F 2200/18* (2013.01); *H03F 2200/387* (2013.01); *H03F 2200/411* (2013.01); *H03F 2200/451* (2013.01); *H03F 2203/7209* (2013.01)

(58) Field of Classification Search
USPC ....................................................... 455/552.1
See application file for complete search history.

(56) References Cited

U.S. PATENT DOCUMENTS

| 5,592,122 | A | 1/1997 | Masahiro et al. |
| 6,232,841 | B1* | 5/2001 | Bartlett ................. H03F 3/2176 330/302 |
| 8,149,050 | B2 | 4/2012 | Cabanillas |
| 8,436,694 | B2 | 5/2013 | Van Bezooijen |
| 8,461,931 | B1 | 6/2013 | Bayruns et al. |
| 8,611,834 | B2 | 12/2013 | Harris et al. |
| 2009/0021332 | A1 | 1/2009 | Brekelmans et al. |
| 2014/0266455 | A1* | 9/2014 | Kaatz ....................... H03F 1/565 330/286 |

FOREIGN PATENT DOCUMENTS

| JP | 2011515832 A | 5/2011 |
| JP | 2011166363 A | 8/2011 |
| KR | 10-2009-0039743 | 4/2009 |
| KR | 10-2012-0093357 | 8/2012 |
| KR | 10-2013-0129367 | 11/2013 |
| TW | 445704 | 7/2001 |

OTHER PUBLICATIONS

Spirito, L.C.N. et al., "Power amplifier PAE and ruggedness optimization by second harmonic control," Proceedings of Bipolar/BiCMOS Circuits and Technology Meeting, 2002, pp. 173-176.

* cited by examiner

MULTI-BAND POWER AMPLIFIER

CROSS-REFERENCE TO RELATED APPLICATION(S)

This application claims priority to U.S. Provisional Application No. 62/140,925 filed Mar. 31, 2015, entitled MULTI-BAND POWER AMPLIFIER. The contents of each of the above-referenced application(s) are hereby expressly incorporated by reference herein in their entireties for all purposes.

BACKGROUND

Field

The present disclosure generally relates to power amplifiers

Description of the Related Art

To boost the power amplifier efficiency while maintaining good linearity, class F and inverse class F power amplifiers have been adopted by many linear power amplifier designers. However, maintaining the operation of class F and inverse class F power amplifiers often requires the use of harmonic terminations at the output of the power amplifier. Maintaining good harmonic terminations across a broad frequency bandwidth while achieving a higher maximum power amplifier efficiency can be difficult. For example, usually the power amplifier efficiency drops as bandwidth increases.

SUMMARY

In some implementations, the present disclosure relates to a power amplifier module. The power amplifier module includes a power amplifier including an output stage, the power amplifier configured to receive a signal. The power amplifier module also includes a first programmable harmonic termination circuit in electrical communication with the output stage of the power amplifier, the first programmable harmonic termination circuit including a first plurality of capacitors and a first plurality of switches, at least one of the first plurality of capacitors in electrical communication with at least one of the first plurality of switches. The power amplifier module further includes a controller configured to modify a configuration of the first plurality of switches of the first programmable harmonic termination circuit based at least in part on a second harmonic frequency of the signal.

In some embodiments, the power amplifier module further includes a second programmable harmonic termination circuit in electrical communication with the output stage of the power amplifier, the second programmable harmonic termination circuit including a second plurality of capacitors and a second plurality of switches.

In some embodiments, at least one of the second plurality of capacitors is in electrical communication with at least one of the second plurality of switches, the controller further configured to modify a configuration of the second plurality of switches of the second programmable harmonic termination circuit based at least in part on a third harmonic frequency of the signal.

In some embodiments, in response to a control signal associated with class F operation, the controller is further configured to modify the configuration of the first plurality of switches of the first programmable harmonic termination circuit to short the second harmonic frequency of the signal and to modify the configuration of the second plurality of switches of the second programmable harmonic termination circuit to present an open impedance to the third harmonic frequency of the signal.

In some embodiments, in response to a control signal associated with inverse class F operation, the controller is further configured to modify the configuration of the first plurality of switches of the first programmable harmonic termination circuit to present an open impedance to the second harmonic frequency of the signal and to modify the configuration of the second plurality of switches of the second programmable harmonic termination circuit to short the third harmonic frequency of the signal.

In some embodiments, the controller is further configured to modify the configuration of the first plurality of switches of the first programmable harmonic termination circuit based at least in part on a selected operational class of the power amplifier.

In some embodiments, the power amplifier supports multiple configurations.

In some embodiments, the power amplifier supports at least two of class F configuration, inverse class F configuration, class E configuration, or class J configuration.

In some embodiments, the power amplifier module further includes an output impedance matching network in electrical communication with the output stage of the power amplifier.

In some embodiments, the power amplifier module further includes a low-pass filter in electrical communication with the output stage of the power amplifier.

In some embodiments, the power amplifier module does not include an output impedance matching network in electrical communication with the output stage of the power amplifier.

In some implementations, the present disclosure relates to a wireless device. The wireless device includes a plurality of load lines, at least some of the load lines corresponding to a different communication frequency band. The wireless device also includes a switch network configured to electrically connect a load line from the plurality of load lines to a power amplifier. The wireless device further includes a power amplifier module including the power amplifier, a first programmable harmonic termination circuit in electrical communication with an output stage of the power amplifier, and a controller, the power amplifier configured to receive a signal, the first programmable harmonic termination circuit including a first plurality of capacitors and a first plurality of switches, at least one of the first plurality of capacitors in electrical communication with at least one of the first plurality of switches, and the controller configured to modify a configuration of the first plurality of switches of the first programmable harmonic termination circuit based at least in part on a second harmonic frequency of the signal.

In some embodiments, the power amplifier module further includes a second programmable harmonic termination circuit in electrical communication with the output stage of the power amplifier, the second programmable harmonic termination circuit including a second plurality of capacitors and a second plurality of switches.

In some embodiments, at least one of the second plurality of capacitors is in electrical communication with at least one of the second plurality of switches, the controller further configured to modify a configuration of the second plurality of switches of the second programmable harmonic termination circuit based at least in part on a third harmonic frequency of the signal.

In some embodiments, the power amplifier supports multiple operational classes.

In some implementations, the present disclosure relates to a power amplifier module. The power amplifier module includes a multistage power amplifier including at least a first stage and a second stage, the multistage power amplifier configured to receive a signal. The power amplifier module also includes an inter-stage programmable harmonic termination circuit located between the first stage and the second stage, the inter-stage programmable harmonic termination circuit including a plurality of capacitors and a plurality of switches, at least one of the plurality of capacitors in electrical communication with at least one of the plurality of switches. The power amplifier module further includes a controller configured to modify a configuration of the plurality of switches of the inter-stage programmable harmonic termination circuit based at least in part on a harmonic frequency of the signal.

In some embodiments, the second stage is an output stage of the power amplifier.

In some embodiments, the harmonic frequency of the signal is one of a second harmonic frequency or a third harmonic frequency.

In some embodiments, the controller is further configured to modify the configuration of the plurality of switches with respect to one of the second harmonic frequency or the third harmonic frequency based at least in part on a particular class of operation of the multistage power amplifier.

In some embodiments, the particular class of operation of the amplifier corresponds to a communication frequency band from a plurality of communication frequency bands supported by the multistage power amplifier.

In some embodiments, the power amplifier module further includes an output stage programmable harmonic termination circuit located subsequent to the second stage and in electrical communication with the second stage.

In some embodiments, the output stage programmable harmonic termination circuit supports multiple classes of operation of the multistage power amplifier.

In some implementations, the present disclosure relates to a wireless device. The wireless device includes a plurality of load lines, at least some of the load lines corresponding to a different communication frequency band. The wireless device also includes a switch network configured to electrically connect a load line from the plurality of load lines to a power amplifier. The wireless device further includes a power amplifier module including a multistage power amplifier, an inter-stage programmable harmonic termination circuit, and a controller, the multistage power amplifier including at least a first stage and a second stage, and configured to receive a signal, the inter-stage programmable harmonic termination circuit located between the first stage and the second stage and including a plurality of capacitors and a plurality of switches, at least one of the plurality of capacitors in electrical communication with at least one of the plurality of switches, and the controller configured to modify a configuration of the plurality of switches of the inter-stage programmable harmonic termination circuit based at least in part on a harmonic frequency of the signal.

In some embodiments, the second stage is an output stage of the power amplifier.

In some embodiments, the harmonic frequency of the signal is one of a second harmonic frequency or a third harmonic frequency.

In some embodiments, the controller is further configured to modify the configuration of the plurality of switches with respect to one of the second harmonic frequency or the third harmonic frequency based at least in part on a particular class of operation of the multistage power amplifier.

In some embodiments, the power amplifier module further includes a programmable harmonic termination circuit in electrical communication with an output of the second stage.

BRIEF DESCRIPTION OF THE DRAWINGS

Throughout the drawings, reference numbers are re-used to indicate correspondence between referenced elements. The drawings are provided to illustrate embodiments of the inventive subject matter described herein and not to limit the scope thereof.

DETAILED DESCRIPTION OF SOME EMBODIMENTS

Introduction

Figure 1:
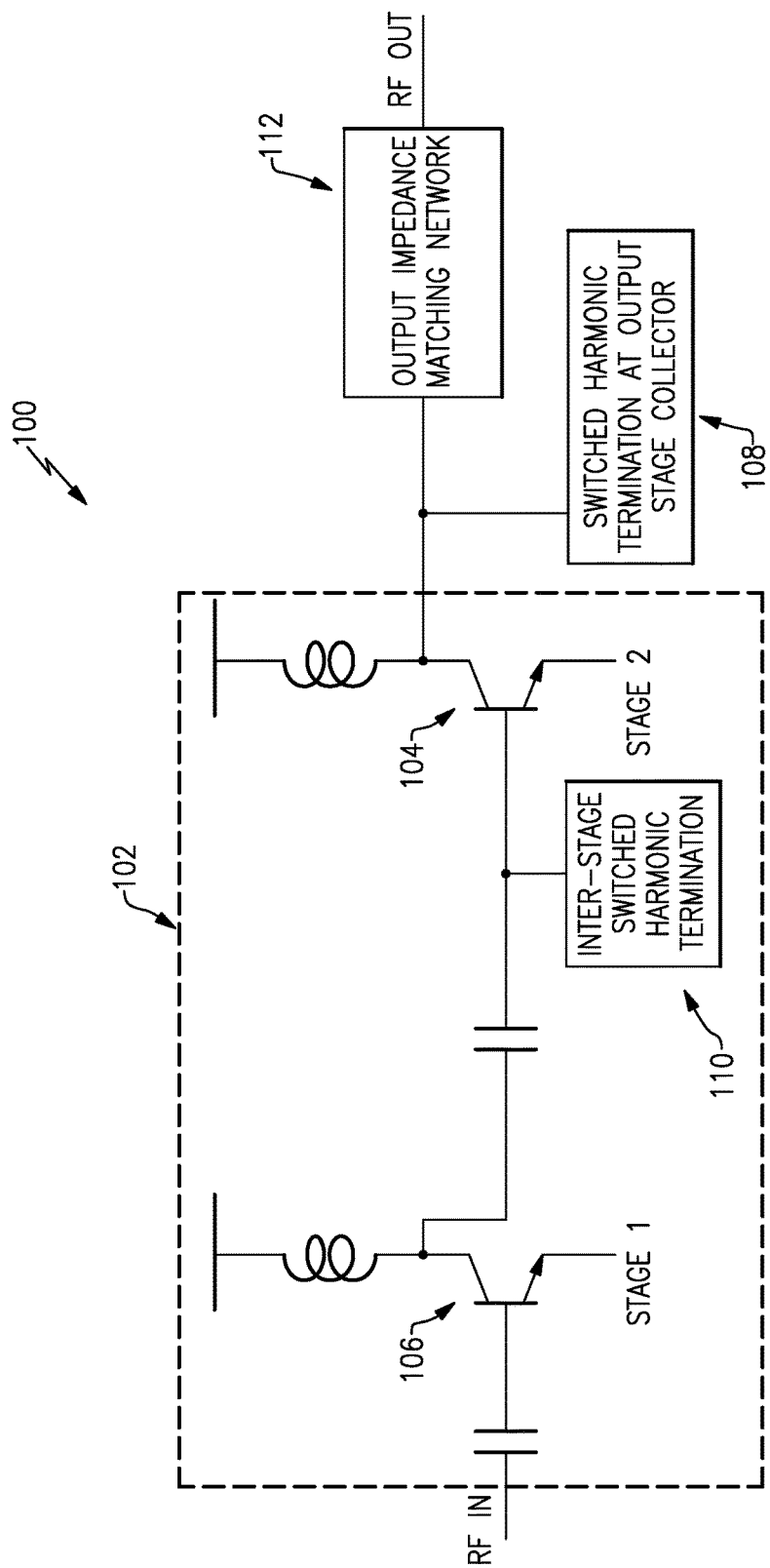
FIG. 1 is a block diagram of one example of a distributed switched harmonic termination circuit.

To boost the power amplifier efficiency while maintaining good linearity, class F and inverse class F power amplifiers have been adopted by many linear power amplifier designers. However, maintaining the operation of class F and inverse class F power amplifiers often requires the use of harmonic terminations at the output of the power amplifier. Maintaining good harmonic terminations across a broad frequency bandwidth while achieving a higher maximum power amplifier efficiency can be difficult. For example, usually the power amplifier efficiency drops as bandwidth increases.

One solution for maintaining power amplifier efficiency across wide bandwidths is to use several power amplifiers to cover an entire desired bandwidth. However, including multiple power amplifiers within the design can increase the cost of a wireless device and requires more space for each of the power amplifiers. Further, wireless devices that support multiple communication technologies (such as 3G and 4G technology) also require multiple sets of power amplifiers to cover the selected bandwidth for each of the communication technologies.

Moreover, often the output impedance of the power amplifier at the collector is approximately 3 ohms. However, the load line is usually at 50 ohms. Thus, a transformer is typically used to step up the battery voltage and to help match the output impedance of the power amplifier to the load line impedance. But, in many cases, the transformation is performed at a particular frequency and is usually relatively narrow band because, for example, the transformation occurs at a single frequency.

Embodiments described herein use a switched harmonic termination network to enable a power amplifier to support multiple classes of operation across a wide bandwidth. In certain embodiments, by including the programmable switched harmonic termination network, the number of power amplifiers included in the wireless device can be reduced. For example, in some cases, a wireless device can include to or even one power amplifiers will supporting multiple classes of operation. Further, the switched harmonic termination network enables the power amplifier to support multiple bands of operation.

In addition, embodiments described herein use a power amplifier design that can step up the voltage at the collector of the power amplifier to, for example, approximately 10 V. By stepping up the voltage, the output impedance of the power amplifier can be close to 50 ohms. Thus, in certain cases, it may be unnecessary to transform the voltage and the voltage transformer can be omitted. Further, the output impedance matching network in electrical communication with the output stage of the power amplifier can be significantly reduced in both size and the amount of impedance transformation provided, and, in some cases, even eliminated or replaced with a low pass filter. Examples of power amplifiers that can be used by embodiments described herein, are described in: U.S. Provisional Application No. 62/116,448, filed on Feb. 15, 2015 and titled "REDUCED POWER AMPLIFIER SIZE THROUGH ELIMINATION OF MATCHING NETWORK"; U.S. Provisional Application No. 62/116,449, filed on Feb. 15, 2015 and titled "ENHANCED POWER AMPLIFIER EFFICIENCY THROUGH ELIMINATION OF MATCHING NETWORK"; U.S. Provisional Application 62/116,450, filed on Feb. 15, 2015 and titled "MULTI-BAND POWER AMPLIFICATION SYSTEM HAVING ENHANCED EFFICIENCY THROUGH ELIMINATION OF BAND SELECTION SWITCH"; U.S. Provisional Application 62/116,451, filed on Feb. 15, 2015 and titled "MULTI-BAND DEVICE HAVING MULTIPLE MINIATURIZED SINGLE-BAND POWER AMPLIFIERS"; and U.S. Provisional Application 62/116,452, filed on Feb. 15, 2015 and titled "RADIO-FREQUENCY POWER AMPLIFIERS DRIVEN BY BOOST CONVERTER," the disclosures of each of which are hereby incorporated herein by reference in their entirety.

Advantageously, in certain embodiments, the use of the switched harmonic termination circuits described herein enable a power amplifier to support operation across a wider bandwidth compared to previous designed. Furthermore, in certain embodiments, the use of the switched harmonic termination circuits enables the power amplifier to provide multiple classes of operation. Thus, in certain embodiments, wireless devices that may have previously required several power amplifiers can use fewer power amplifiers (such as two power amplifiers or one power amplifier) while supporting the same classes of operation and frequency bands.

Example Distributed Switched Harmonic Termination Circuit

FIG. 1 is a block diagram of one example of a distributed switched harmonic termination circuit. FIG. 1 illustrates a portion of a circuit 100 that may be included in a power amplifier module. The circuit 100 includes a power amplifier (PA) 102. In some cases, each of the elements of the circuit 100 may be included as part of the power amplifier 102. Typically, although not necessarily, the power amplifier 102 is a multistage power amplifier that can include a number of stages (for example, two, three, five, or ten stages, and so forth). In the particular example illustrated in FIG. 1, the power amplifier 102 is a two-stage amplifier that includes an input stage 106 and an output stage 104. The transistors of the input stage 106 and the output stage 104 may be bipolar junction transistors (BJTs), heterojunction bipolar transistors (HBTs), gallium arsenide (GaAs) transistors, field effect transistors (FETs), or any other type of transistor that may be used in a power amplifier design.

Although not illustrated, it should be understood that the power amplifier 102 may also include one or more bias circuits for biasing the transistor stages of the power amplifier 102. In some embodiments, different bias values may be applied to the transistor stages (for example, input stage 106 and output stage 104) based on particular communication standard being used at a particular point in time (for example, 2G, 3G, 4G, or 4G LTE). Moreover, the PA 102 may include a PA design that reduced or eliminates the need for an output impedance matching network to match an impedance of a load line, such as described in the provisional applications incorporated by reference above (U.S. Provisional Application No. 62/116,448, U.S. Provisional Application No. 62/116,449, U.S. Provisional Application No. 62/116,450, U.S. Provisional Application No. 62/116,451, U.S. Provisional Application No. 62/116,452).

As illustrated in FIG. 1, the power amplifier 102 includes an inter-stage switched harmonic termination 110 (sometimes referred to as or including a harmonic trap filter). The circuit 100 also includes an output stage switched harmonic termination 108 (sometimes referred to as or including a harmonic trap filter) electrically connected to a collector of the output stage transistor 104. In some embodiments, the inter-stage switched harmonic termination 110 and the output stage switched harmonic termination 108 may function in conjunction to provide a distributed harmonic termination for one or more harmonics of a signal. Advantageously, in certain embodiments, using an inter-stage switched harmonic termination 110 can improve the efficiency of the output stage 104.

As stated above, the power amplifier 102 can include a number of stages. In cases where the power amplifier 102 includes more than two stages, such as three or four stages, it is possible to distribute the switched harmonic termination among multiple inter-stage harmonic terminations, as well as the output stage harmonic termination 108. For example, there could be an inter-stage switched harmonic termination between a first stage and a second stage, and between a second stage and a third stage of a three stage power amplifier. However, with many power amplifiers, the signal is relatively small at the transistor stages before the output transistor stage. Thus, in many such cases, the inter-stage switched harmonic termination may exist only before the output stage of the power amplifier.

The switched harmonic terminations 110 and 108 may each include circuits for processing a second harmonic signal (2FO) and a third harmonic signal (3FO). In some cases, the switched harmonic terminations 110 and 108 may be configured as a short or an open impedance to one or both of the second harmonic signal and the third harmonic signal. Generally, although not necessarily, the switched harmonic terminations 110 and 108 may be configured as a short for the second harmonic signal or the third harmonic signal and an open impedance for the other the second harmonic signal or the third harmonic signal. Typically, the switched harmonic terminations 110 and 108 are configured to process the second harmonic signal and/or the third harmonic signal of a signal received at the RF input to the power amplifier 102. Other harmonics of the signal are generally ignored. However, in some cases, one or more of the switched harmonic terminations 108 and 110 may be configured to process additional harmonics of the signal received at the RF input to the power amplifier 102.

Advantageously, in certain embodiments, electrically connecting one or more harmonic terminations to the power amplifier can improve the efficiency of the power amplifier and can shape the voltage wave form and the current wave form to get an improved amplifier. For example, an improved class F amplifier can be obtained by shaping the voltage waveform to be more like a square wave and the current waveform to be like a half sine wave so that the amount of current and voltage across the transistor is reduced and the power dissipated in the output transistor is reduced, while providing the desired output power.

A class F power amplifier is often used because it can have a relatively flat gain versus output power with minimal phase shift versus output power until the PA reaches a compression point. Thus, a class F amplifier can be used for a linear PA. However, embodiments herein can use PAs of other classes, such as, but not limited to, class E or inverse class F. Moreover, while a number of harmonic terminations can be included to short the even harmonics and to provide an open impedance for the odd harmonics, generally, a harmonic termination is provided for only the second and third harmonic because, for example, the additional harmonics have a lower impact on the received signal and the design can be simplified. However, it is possible to include harmonic termination circuits for additional harmonics.

Typically, the fundamental frequency may be processed by an output impedance matching network or a low pass filter. In other cases, the fundamental frequency may be provided as an RF output of the circuit 100.

In some embodiments, the circuit 100 also includes an output impedance matching network 112. In some cases, the output impedance matching network 112 may include a dynamic output impedance matching network. For example, in some embodiments, the output impedance matching network 112 may include one or more of the embodiments described in U.S. Provisional Application No. 62/057,451, filed on Sep. 30, 2014 and titled "AUTOMATIC IMPEDANCE MATCHING USING TRUE POWER INFORMATION," which is hereby incorporated by reference in its entirety. Alternatively, the output impedance matching network 112 may be substituted with a low pass filter. In some cases, the circuit 100 may include the output impedance matching network 112 and a low pass filter.

Figure 2:
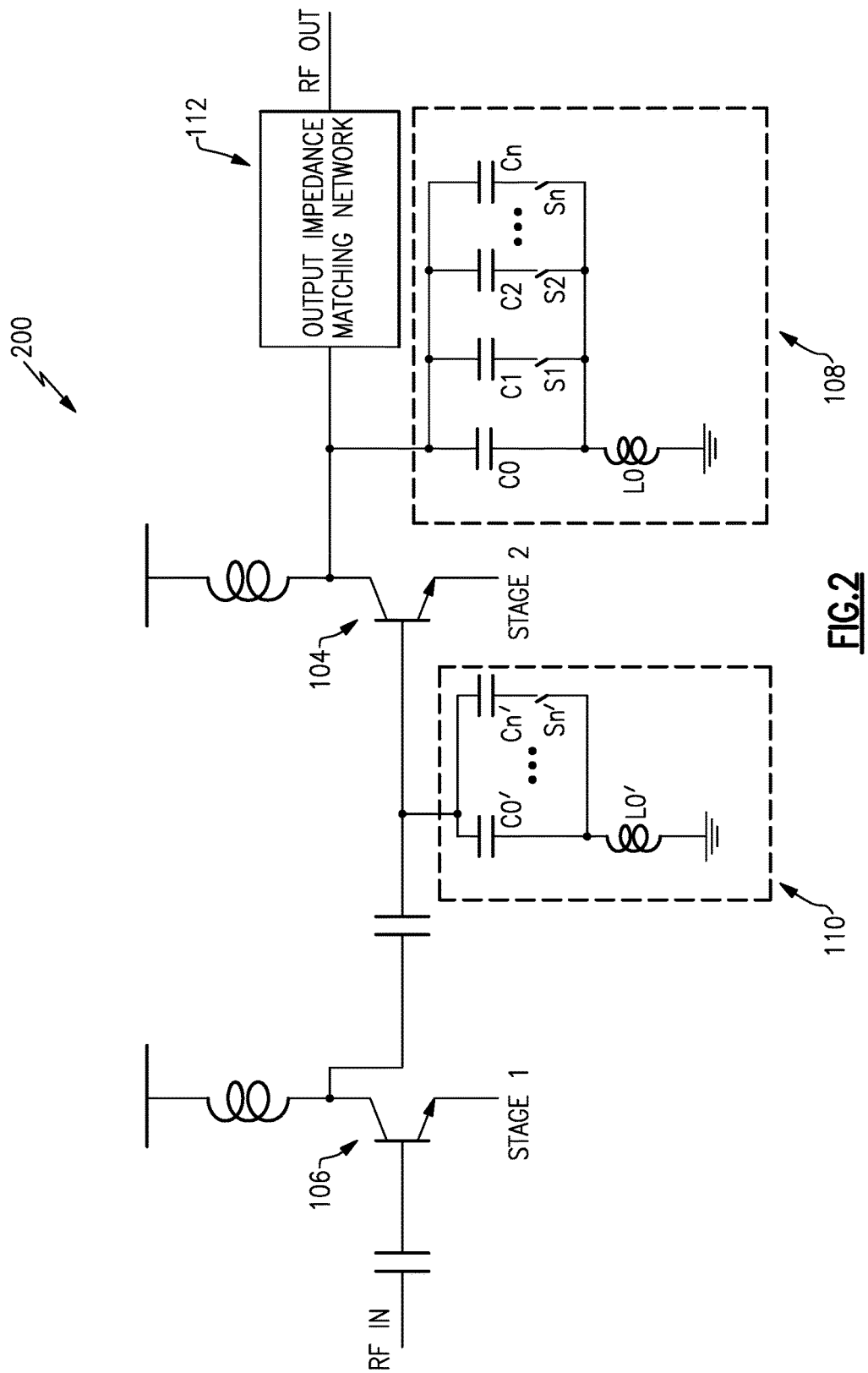
FIG. 2 is a circuit diagram of one example of a distributed switched harmonic termination circuit.
Figure 3:
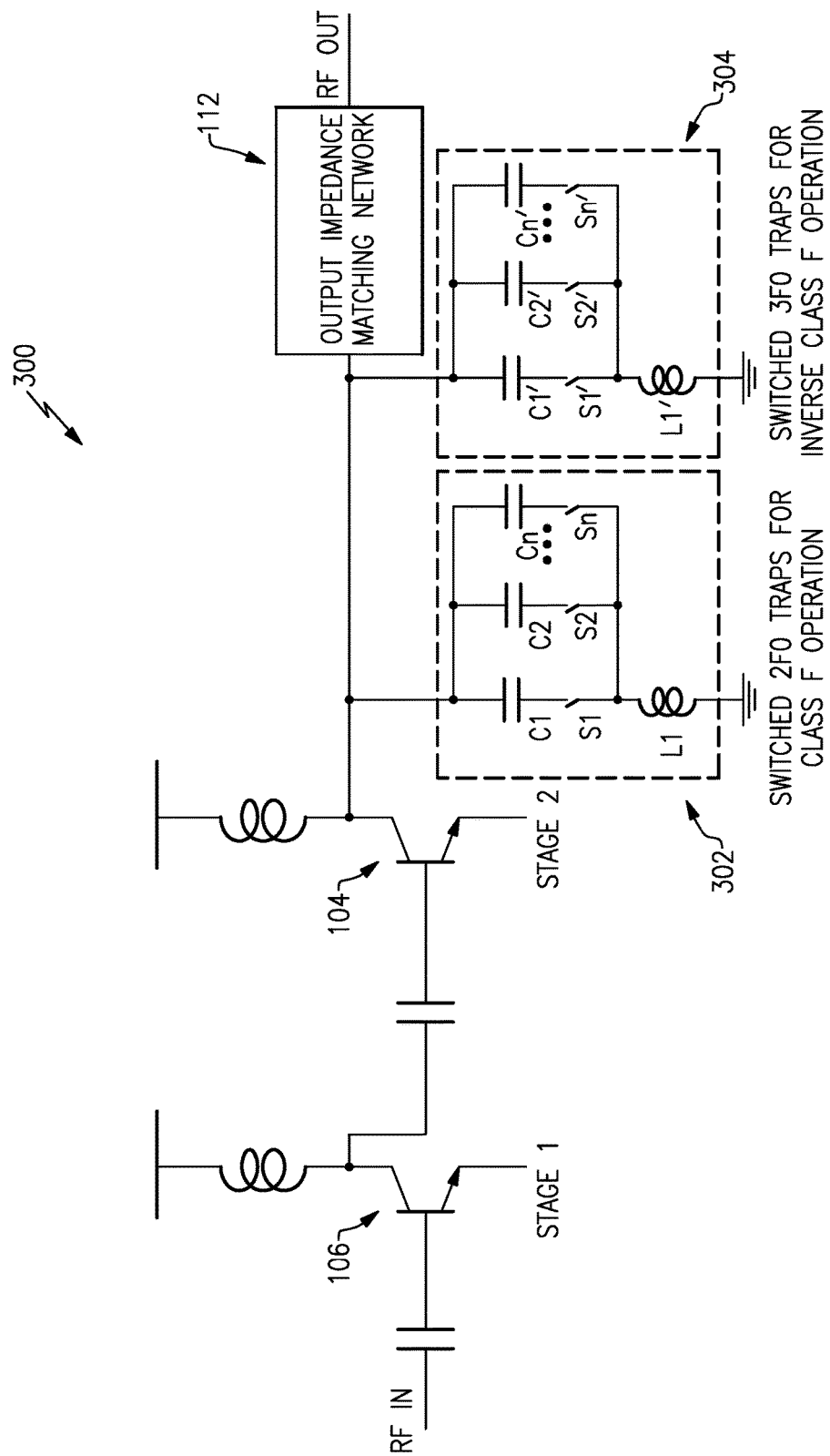
FIG. 3 is a circuit diagram of one example of a switched harmonic termination circuit supporting multiple power amplifier operation classes.
Figure 4:
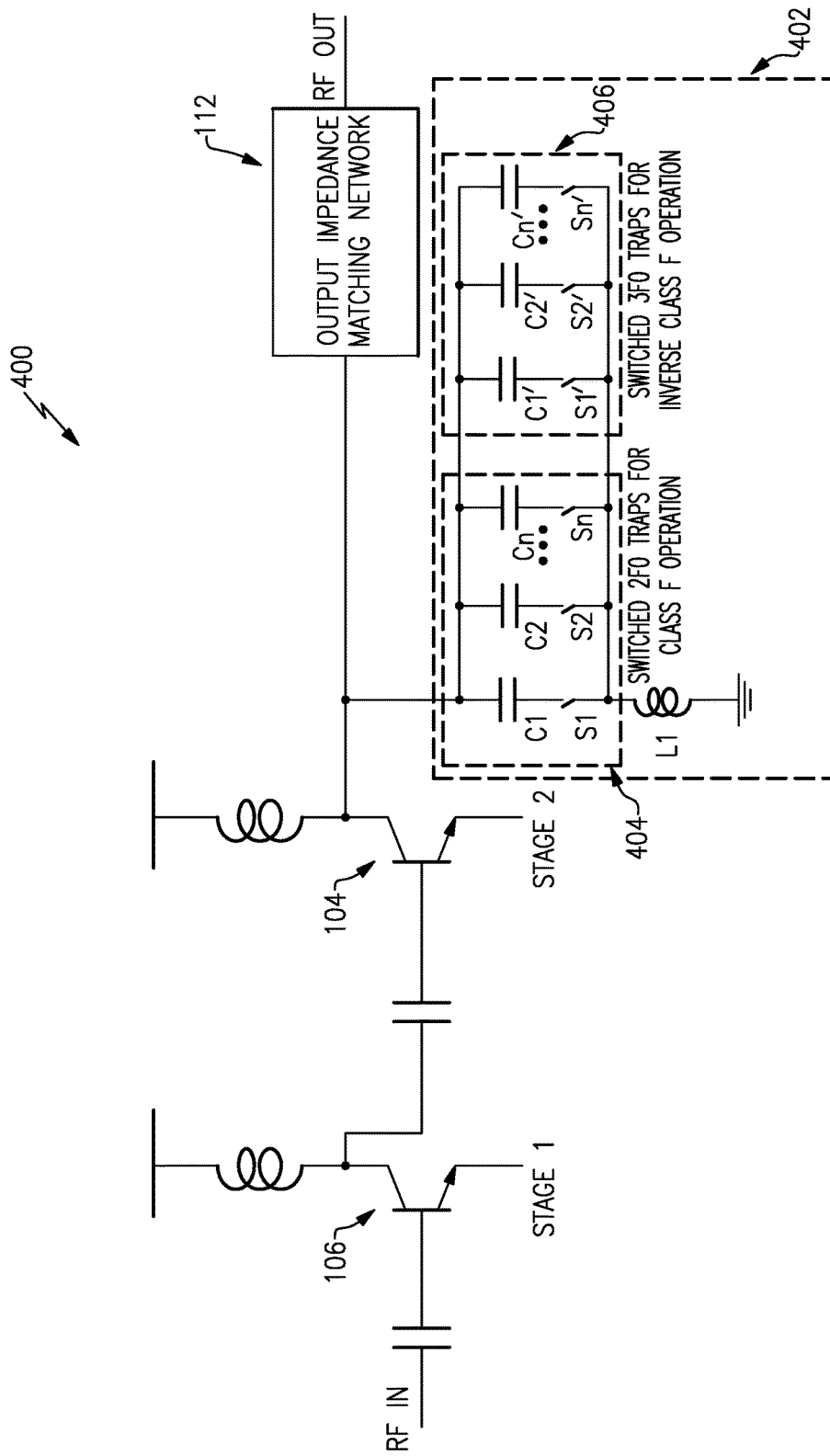
FIG. 4 is a circuit diagram of one example of a switched harmonic termination circuit supporting multiple power amplifier operation classes with shared circuit elements.

FIG. 2 is a circuit diagram 200 of one example of a distributed switched harmonic termination circuit. FIGS. 2, 3, and 4 omit the reference 102 and corresponding dashed line box from FIG. 1 for ease of illustration. However, it should be understood that the transistor stages 106 and 104 are part of the power amplifier 102 as illustrated, for example, with respect to FIG. 1.

As illustrated in FIG. 2, the inter-stage switched harmonic termination 110 may include an inductor L0' and a number of capacitors C0' through CN'. Further, the inter-stage switched harmonic termination 110 may include a number of switches that can be used to electrically connect one or more of the capacitors C0' through CN' to the inductor L0' and the base of the output stage transistor 104. Although a switch is not illustrated between the capacitor C0' and inductor L0', it should be understood that such a switch may exist. Similarly, although a switch is not illustrated between the inter stage switched harmonic termination 110 and the power amplifier, it should be understood that such a switch may exist.

As with the inter-stage switched harmonic termination 110, the output stage switched harmonic termination 108 may include an inductor L0, a number of capacitors C0 through CN, and one or more switches, such as switches S1 through SN. The switches S1 through SN can electrically connect one or more of the capacitors C0 through CN to the inductor L0 and a collector of the output stage transistor 104. Although a switch is not illustrated between the capacitor C0 and inductor L0, it should be understood that such a switch may exist. Similarly, although a switch is not illustrated between the output stage switched harmonic termination 108 and the output stage of the power amplifier, it should be understood that such a switch may exist. The switches can be silicon on insulator (SOI) switches.

Advantageously, in certain embodiments, by including switched capacitors in the harmonic termination circuits 108 and 110, the harmonic termination circuits can be optimized for specific frequency bands. Further, the ability to modify the harmonic termination circuits across frequency bands enables a wireless device that previously would have included, for example, eight PAs or the low-band and mid-band operation, to include two or one PAs. Moreover, the inclusion of switchable capacitors enables dynamic tuning of the harmonic termination circuits for different operational frequencies based on manufacturer specifications and/or a particular communication network in wireless communication with the wireless device that includes the PA 102.

It is noted that in some existing power amplifier designs, it is not possible to switch in different impedances for the harmonic termination circuits because the output impedance of the PA was too low compared to the load line. Advantageously, in certain embodiments, the higher output impedance of the PAs described in the previously incorporated provisional applications (U.S. Provisional Application No. 62/116,448, U.S. Provisional Application No. 62/116,449, U.S. Provisional Application No. 62/116,450, U.S. Provisional Application No. 62/116,451, U.S. Provisional Application No. 62/116,452) enable the use of the switched harmonic terminations thereby enabling a PA to support multiple classes of operation and wider bands of operation.

Each of the inter-stage switched harmonic termination 110 and the output stage switched harmonic termination 108 may receive one or more control signals from a controller (not shown). These control signals may be used to control the state of the switches of the harmonic termination circuits. Advantageously, in certain embodiments, the ability to modify the harmonic termination circuits 108 and 110 enables the power amplifier to be used with a multitude of frequency bands. Further, in certain embodiments, the ability to modify the harmonic termination circuits 108 and 110 enables the power amplifier to be modified to satisfy multiple classes of operation (for example, class E, class F, or inverse class F, and so forth).

Example Switched Harmonic Termination—Multiple PA Operation Classes

FIG. 3 is a circuit diagram of one example of a switched harmonic termination circuit supporting multiple power amplifier operation classes. In the example illustrated in FIG. 3, a circuit 300 supports both class F operation and inverse class F operation. The circuit 300 includes a harmonic termination circuit 302 and a harmonic termination circuit 304.

The harmonic termination circuit 302 is configured to support class F operation for the power amplifier. In certain embodiments, the harmonic termination circuit 302 is configured to process the second harmonic, 2FO, for an RF input signal received by the power amplifier. As the frequency of the signal received by the power amplifier changes, so do the harmonic frequencies. The harmonic termination circuit 302 can be modified to adjust the harmonic termination for the second harmonic of the received signal by electrically connecting or disconnecting one or more of the capacitors C1 through Cn. Further, the harmonic circuit 302 includes an inductor L1 in series with the capacitors C1 through Cn to create an LC circuit.

The harmonic termination circuit 304 is configured to support inverse class F operation for the power amplifier. In certain embodiments, the harmonic termination circuit 304 is configured to process the third harmonic, 3FO, for an RF input signal received by the power amplifier. The harmonic termination circuit 304 can be modified to adjust the harmonic termination for the third harmonic of the received signal by electrically connecting or disconnecting one or more of the capacitors C1' through Cn'. Further, the harmonic circuit 304 includes an inductor L1 in series with the capacitors C1' through Cn' to create an LC circuit.

Further, the circuit 300 may include additional circuitry, which may be included as part of the output impedance machine network 112 or separately, for processing additional harmonics. For example, in cases where the power amplifier is operating as a class F power amplifier, the circuit 300 may use the additional circuitry to process a third harmonic for the RF input signal. Similarly, in cases where the power amplifier is operating as an inverse class F power amplifier, the circuit 300 may use the additional circuitry to process a second harmonic for the RF input signal.

FIG. 4 is a circuit diagram of one example of a switched harmonic termination circuit supporting multiple power amplifier operation classes with shared circuit elements. In the example illustrated in FIG. 4, a circuit 400 supports both class F operation and inverse class F operation, similar to the circuit 300. The circuit 400 includes a combination harmonic termination circuit 402 that is capable of supporting multiple power amplifier operating classes. In the particular example illustrated in FIG. 4, the combination harmonic termination circuit 402 includes a harmonic termination circuit 404 that supports class F operation and a harmonic termination circuit 406 that supports inverse class F operation.

As illustrated in FIG. 4, the harmonic termination circuits 404 and 406 share an inductor L1. In some implementations, the harmonic termination circuits 402 and 404 may share one or more capacitors. Advantageously, in certain embodiments, by the harmonic termination circuits 404 and 406 sharing one or more circuit elements, the combination harmonic termination circuit 402 may be smaller and cheaper to manufacture compared to individual harmonic termination circuits. In some cases, for power amplifiers and support more than two classes of operation, the advantage obtained by sharing circuit elements across harmonic termination circuits may be multiplied.

Example Class F Operation Switched Harmonic Termination Circuit

Figure 5:
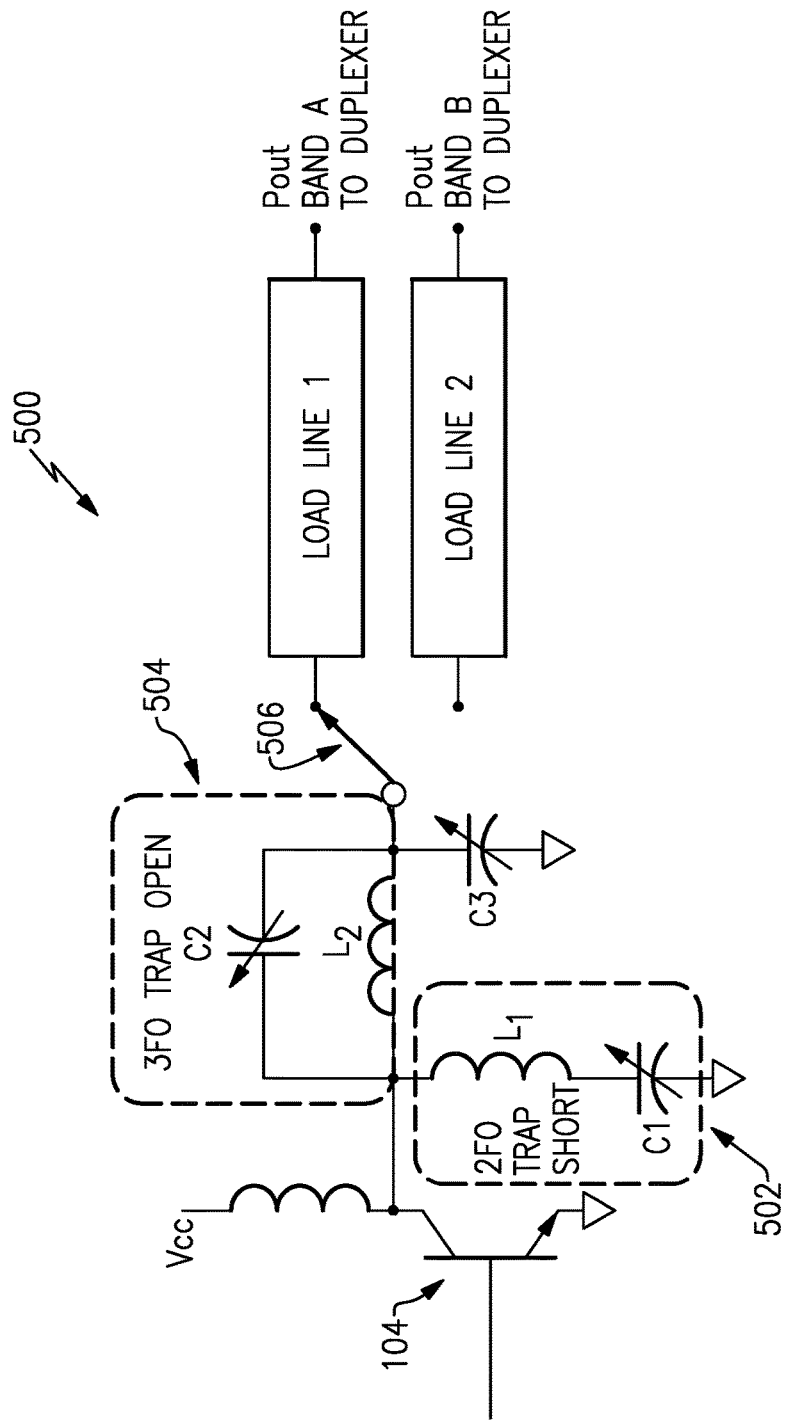
FIG. 5 is a circuit diagram of one example of a switched harmonic termination circuit for class F operation of a power amplifier.

FIG. 5 is a circuit diagram of one example of a switched harmonic termination circuit 500 for class F operation of a power amplifier. The switched harmonic termination circuit 500 includes a harmonic termination circuit 502 and a harmonic termination circuit 504. The harmonic termination circuit 502 may be configured to short the second harmonic of an RF signal. In contrast, the harmonic termination circuit 504 is configured to present an open impedance to a third harmonic of the RF signal.

The harmonic termination circuit 502 may be formed from an inductor L1 and a plurality of switched capacitors represented by the switched capacitor C1. The inductor L1 and the switched capacitors C1 may be electrically connected in series. Advantageously, in certain embodiments, by using a plurality of switched capacitors, the harmonic termination circuit 502 may be tuned to support a wider bandwidth than a static harmonic termination circuit.

The harmonic termination circuit 504 may include an inductor L2 and a plurality of switched capacitors represented by the switched capacitor C2. The inductor L2 and the switched capacitor C2 may be electrically connected in parallel. Advantageously, in certain embodiments, by using a plurality of switched capacitors, the harmonic termination circuit 504 may be tuned to support a wider bandwidth than a static harmonic termination circuit.

As the frequency of a received signal varies, so may the configuration of the harmonic termination circuits 502 in 504. Further, the power amplifier of FIG. 5 can support multiple communication bands. For example, as illustrated in FIG. 5, a switch 506 may be used to electrically connect the power amplifier to one of the load line 1 or the load line 2, which may correspond to a communication band A or communication band B, respectively.

Example Inverse Class F Operation Switched Harmonic Termination Circuit

Figure 6:
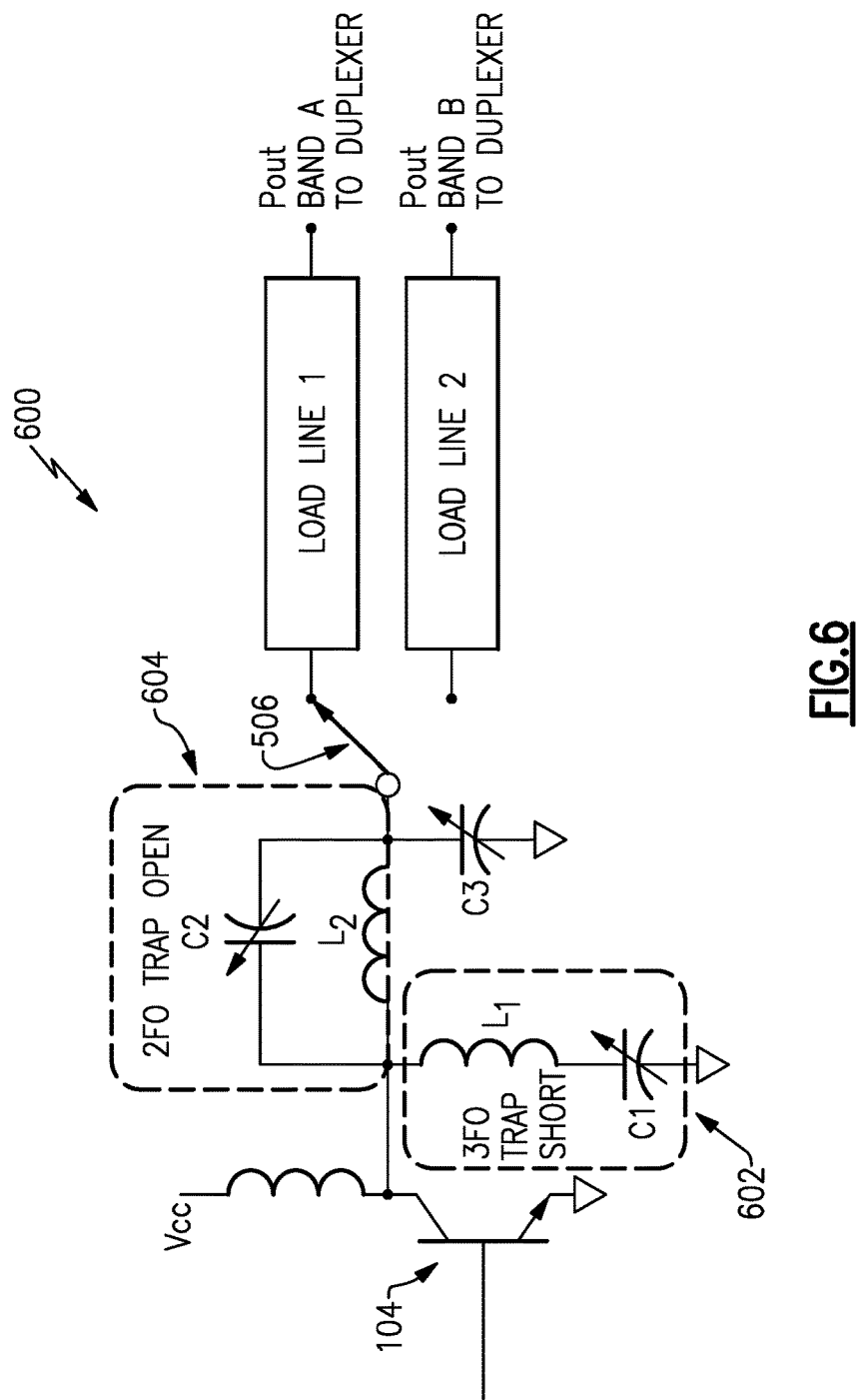
FIG. 6 is a circuit diagram of one example of a switched harmonic termination circuit for inverse class F operation of a power amplifier.

FIG. 6 is a circuit diagram of one example of a switched harmonic termination circuit 600 for inverse class F operation of a power amplifier. In certain embodiments, the PA 102 may be configured for use with relatively high frequencies. In some such cases, it can be difficult to configure the PA 102 as a class F amplifier. Thus, in certain embodiments, the PA 102 may be configured as an inverse class F amplifier. Advantageously, in certain embodiments, including the switched harmonic termination circuit 600 enables the PA 102 to be used as an inverse class F PA 102. Further, as illustrated with respect to FIGS. 3 and 4, a single PA can be used to provide both class F and inverse class F operation using embodiments described herein. Thus, a wireless device can support both classes of operation with one PA instead of two PAs.

The switched harmonic termination circuit 600 includes a harmonic termination circuit 602 and a harmonic termination circuit 604. The harmonic termination circuit 602 may be configured to short the third harmonic of an RF signal. In contrast, the harmonic termination circuit 604 is configured to present an open impedance to a second harmonic of the RF signal. In other words, the switched harmonic termination circuit 600 may be configured inversely to the switched harmonic termination circuit 500. Further, similar to FIG. 5, the power amplifier of FIG. 6 can support multiple communication bands.

The harmonic termination circuit 602 may be formed from an inductor L1 and a plurality of switched capacitors represented by the switched capacitor C1. The inductor L1 and the switched capacitors C1 may be electrically connected in series. The harmonic termination circuit 604 may include an inductor L2 and a plurality of switched capacitors represented by the switched capacitor C2. The inductor L2 and the switched capacitor C2 may be electrically connected in parallel. Advantageously, as with the circuits 502 and 504, in certain embodiments, by using a plurality of switched capacitors, the harmonic termination circuits 602 and 604 may be tuned to support a wider bandwidth than a static harmonic termination circuit.

Example Class E Operation Switched Harmonic Termination Circuit

Figure 7:
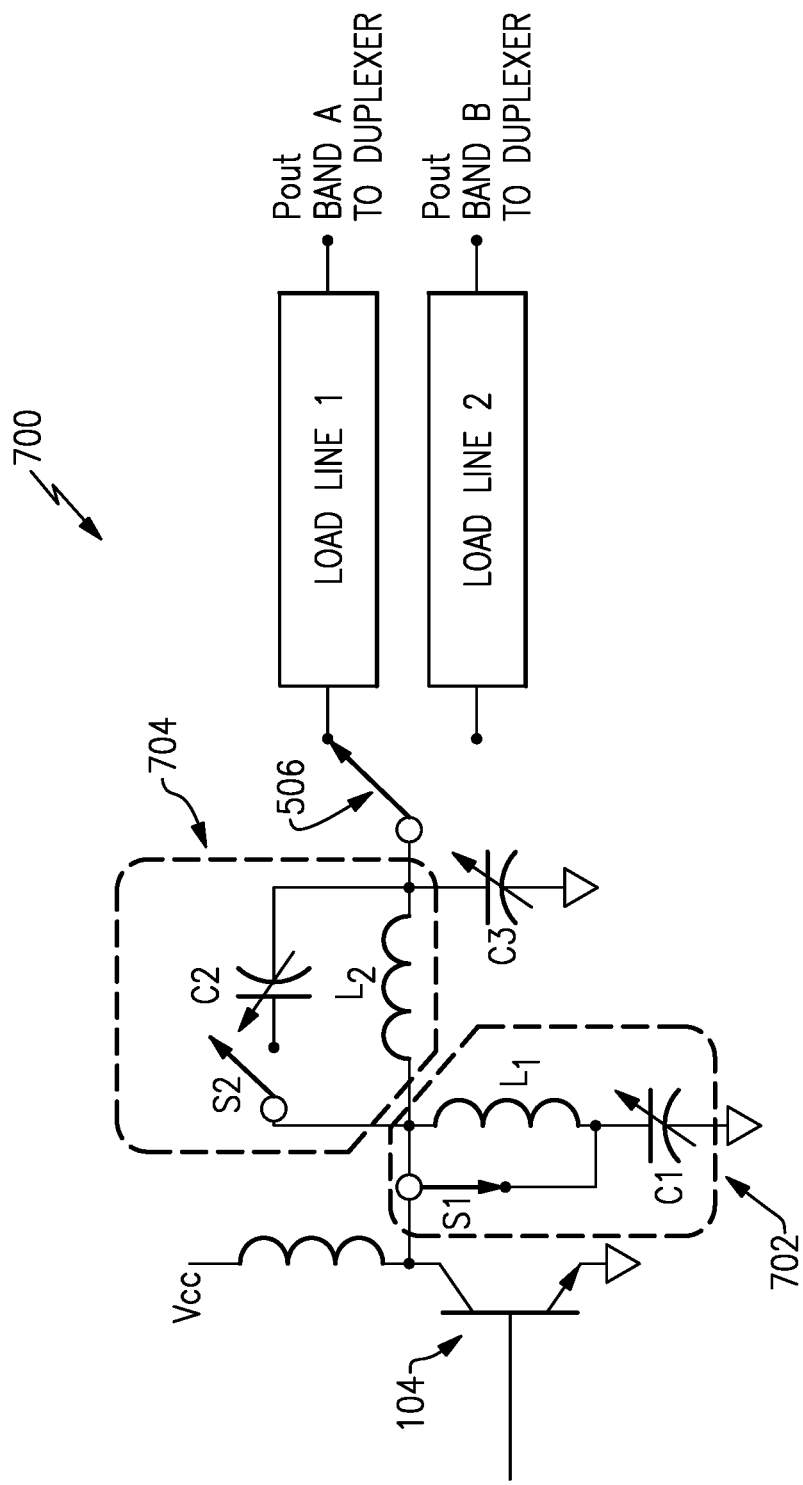
FIG. 7 is a circuit diagram of one example of a switched harmonic termination circuit for class E operation of a power amplifier.

FIG. 7 is a circuit diagram of one example of a switched harmonic termination circuit 700 for class E operation of a power amplifier. The switched harmonic termination circuit 700 includes a harmonic termination circuit 702 and a harmonic termination circuit 704. The harmonic termination circuit 702 may be configured similarly to one of the harmonic termination circuits 502 or 604. Similarly, the harmonic termination circuit 704 may be configured similarly to one of the harmonic termination circuits 504 or 604. In addition, the harmonic termination circuits 702 and 704 may each include a switch S1 and S2, respectively in electrical located between the collector of the power amplifier 104 and the switched capacitors C1 and C2, respectively. The design illustrated in FIG. 7 can be used to support a class E power amplifier when the switch S1 is closed and the switch S2 is open, as illustrated in FIG. 7.

In certain embodiments, the circuit 700 can also support one or more of class F or inverse class F operation for the power amplifier. The switches S1 and S2 can be opened or closed based on a control signal received from a controller (not shown). By opening S1 and closing S2, the harmonic termination circuits 702 and 704 can be configured as illustrated in FIGS. 6 and 7 with respect to the harmonic termination circuits illustrated therein. Thus, by modifying the configuration of the switches S1 and S2, the power amplifier can be switched to operate as a class F or inverse class F power amplifier. Further, similar to FIGS. 5 and 6, the power amplifier of FIG. 7 can support multiple communication bands as illustrated by the inclusion of switch 506 and load lines 1 and 2.

Example Power Amplifier Module

Figure 8:
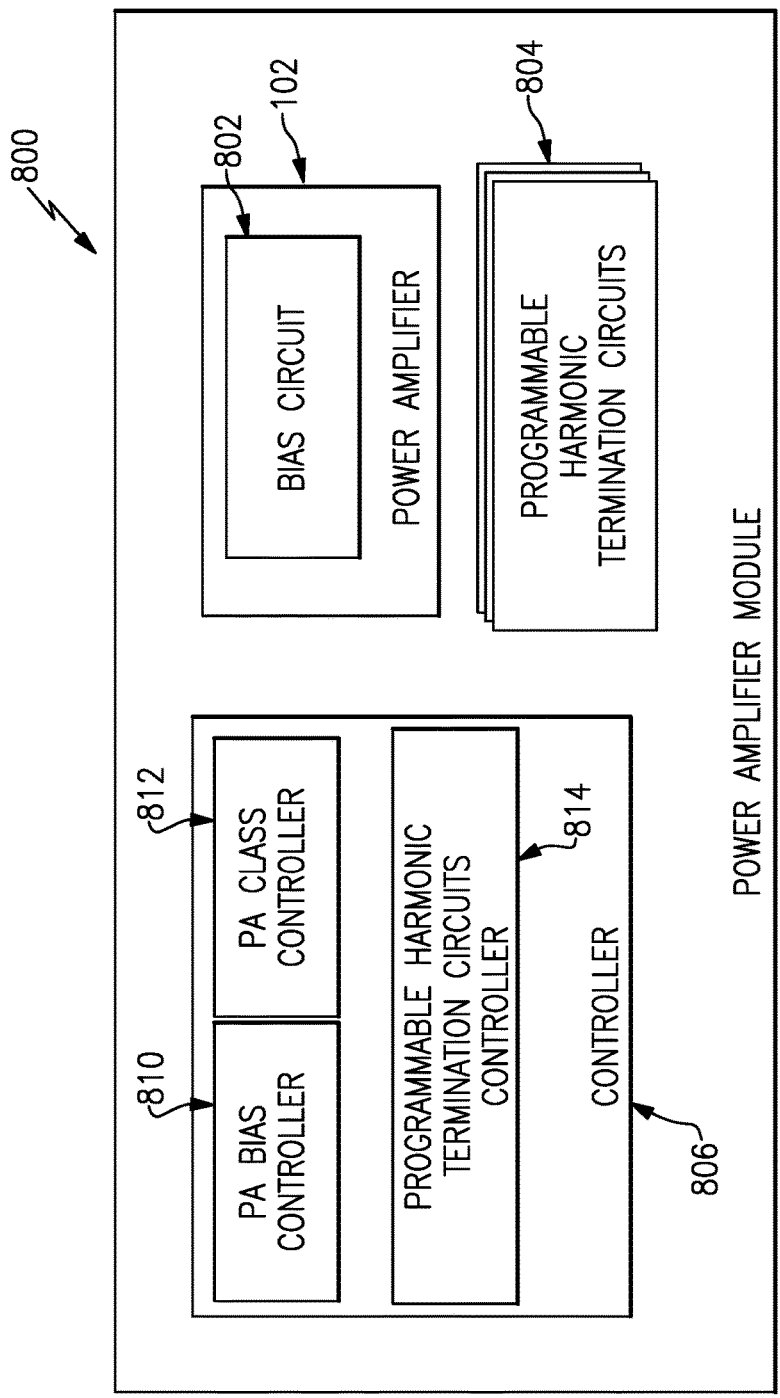
FIG. 8 is a block diagram of one example of a power amplifier module that can include a multi-band power amplifier.

FIG. 8 is a block diagram of one example of a power amplifier module 800 that can include a multi-band power amplifier 102. The power amplifier module 800 can include a number of elements. These elements may include, for example, a power amplifier 102 and a controller 806. Each of these power amplifier module elements may be implemented on the same circuit die. Alternatively, at least some of the elements of the power amplifier module 800 may be implemented on a different circuit die. Advantageously, by implementing elements on a different circuit die, different semiconductor technologies may be used for different circuit elements of the power amplifier module 800. For example, the PA 102 may be implemented using gallium arsenide (GaAs) technology while the controller 806 may be implemented using silicon (Si).

The power amplifier 102 may include a bias circuit 802 which can bias one or more stages of the power amplifier 102. Biasing the one or more stages of the power amplifier 102 may include supplying a bias current to the transistors of the power amplifier 102.

Further, the power amplifier module 800 may include one or more programmable harmonic termination circuits 804. For example, the programmable harmonic termination circuits 804 may include one or more of the switched harmonic termination circuit 108, 110, 302, 304, 402, 404, 406, 502, 504, 602, 604, 702, or 704. The selection of a programmable harmonic termination circuit 804 and/or the configuration of a selected programmable harmonic termination circuit 804 may be performed by controller 806.

The controller 806 may include a programmable harmonic termination circuits controller 814, a PA bias controller 810, and a PA class controller 812. The PA bias controller 810 may include a controller for selecting a bias circuit 802 and/or for controlling a bias current supplied by the bias circuit 802. The PA bias controller 810 may set the operating point for the PA 102 by modifying the bias circuit 802.

The PA class controller 812 may include a controller for selecting an operational class of the power amplifier 102. Further, the PA class controller 812 may select one or more programmable harmonic termination circuits 804 to electrically connect to the power amplifier 102 based on a selection of the class for the power amplifier 102. For example, if the power amplifier 102 is to operate as a class F power amplifier, the PA class controller 812 may select programmable harmonic termination circuits 502 and 504 as the programmable harmonic termination circuits 804 to be in electrical communication with the power amplifier 102.

The programmable harmonic termination circuits controller 814 may include a controller for configuring the programmable harmonic termination circuits 804. Configuring the programmable harmonic termination circuits 804 can include opening or closing one or more switches of the programmable harmonic termination circuits 804 so as to electrically connect one or more capacitors of the programmable harmonic termination circuits 804 to the power amplifier 102. For example, supposing that the programmable harmonic termination circuits 804 includes the combination harmonic termination circuit 402, one or more of the switches S1 through Sn and/or one or more of the switches S1' through Sn' may be configured by the programmable harmonic termination circuits controller 814.

In some embodiments, the control signals supplied by one or more of the controllers of the controller 806 may be determined by a manufacturer of the power amplifier module 800 and/or of a wireless device including the power amplifier module 800. For example, the manufacturer designs the wireless device including a power amplifier module 802 function within a particular frequency band and/or using a particular class a power amplifier, a manufacturer may program one or more controls into a memory of the wireless device. The controller 806 may access the memory of the wireless device to determine the one or more control signals for the power amplifier 102, the bias circuit 802, and/or the programmable harmonic termination circuits 804.

Alternatively, or in addition, the controller 806 may determine control signals based at least in part on an operating environment of the wireless device. Further, in some cases, the controller 806 may determine control signals based at least in part controls and/or a request by a base station communicating with the wireless device that includes the power amplifier module 800.

Example Wireless Device

Figure 9:
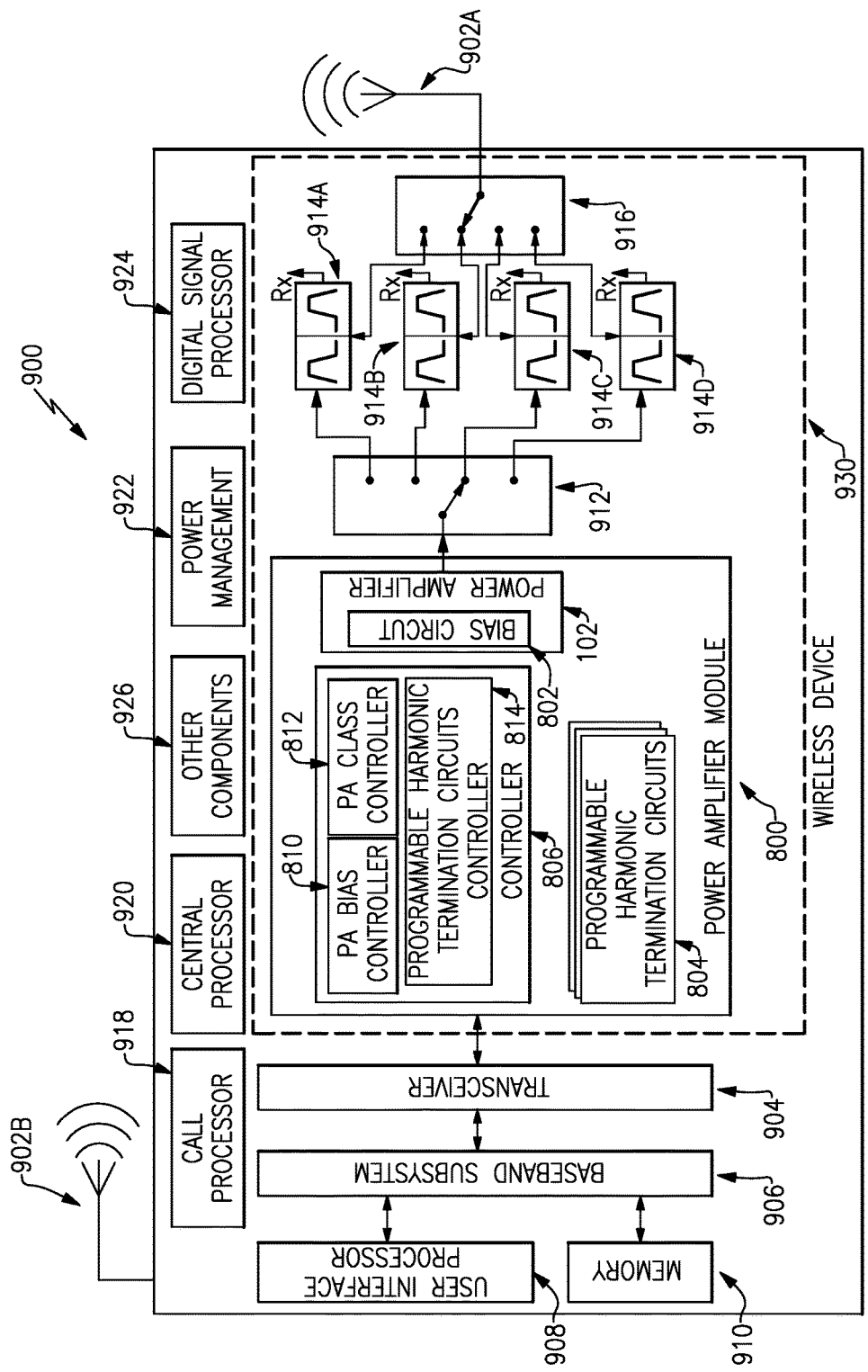
FIG. 9 is a block diagram of one example of a wireless device that can include the power amplifier module of FIG. 8.

FIG. 9 is a block diagram of one example of a wireless device 900 that can include the power amplifier module 800 of FIG. 8. Although the wireless device 900 illustrates only one power amplifier module (PAM), it is possible, in some cases, for the wireless device 900 to include a number of PAMs, each of which may or may not be of the same configuration as PAM 800. However, embodiments of the present disclosure enable a wireless device to support multiple amplifier classes of operation and multiple communications bands and technologies using one power amplifier 102. Thus, although some wireless device 900 may include multiple PAMs 800, in certain embodiments, the wireless device 900 can include a single PAM 800 while supporting multiple communications standards (such as 2G, 3G, 4G, and 4G LTE, and so forth). Moreover, it should be understood that the wireless device 900 is but one non-limiting example of a wireless device and that other embodiments of the wireless device 900 are possible.

In some embodiments, the power amplifier module 800 may be included as part of a larger power amplification system 930, which may be a system on chip (SoC or SOC). This power amplification system 930 may be part of a transmitter. As illustrated in FIG. 9, the wireless device 900 may include a separate transceiver 904 in electrical communication with the power amplification system 930. However, in other embodiments, the power amplification system 930 may be part of the transceiver 904. In some implementations, the power amplification system 930 may be part of a front end module (FEM).

The power amplification system 930 may include a number of switches. For example, the power amplification system 930 may include an antenna switch 916 for transmission or reception of signals from an antenna 902A across one or more frequency bands. Further, the power amplification system 930 may include a switch 912 for selecting different load lines based on one or more supported communication bands. In addition, the switches 912 and 916 may be used to select from a plurality of duplexers 914A, 914B, 914C, and 914D (which may collectively be referred to as duplexers 914). The duplexers 914 enable bi-directional communication with the antenna 902A.

In some cases, the PAM 800 can receive RF signals from a transceiver 904 that can be configured and operated in known manners to generate RF signals to be amplified and transmitted, and to process received signals. In some implementations, the PAM 800 is included as part of a transmitter, which may be included in the transceiver 904. In some such cases, the PAM 800 may process signals for transmission without processing received signals. In other implementations, the PAM 800 may process both received signals and signals for transmission to, for example, a base station.

The transceiver 904 may interact with a baseband sub-system 906 that is configured to provide a conversion between data and/or voice signals suitable for processing by one or more user interface elements and RF signals suitable for processing by the transceiver 904. The transceiver 904 may also be electrically connected to a power management component 922 that is configured to manage power for the operation of the wireless device. Such power management can also control operations of the baseband sub-system 906 and the PAM 800, among other components. Further, the power management component 922 may provide a supply voltage to a switch mode boost converter (not shown), which may boost the voltage before providing the voltage to the PA 102. It should also be understood that the power management component 922 may include a power supply, such as a battery. Alternatively, or in addition, one or more batteries may be separate components within the wireless device 900.

A number of connections between the various components of the wireless device 900 are possible, and are omitted from FIG. 9 for clarity of illustration only and not to limit the disclosure. For example, the power management component 922 may be electrically connected to the baseband subsystem 906, the PAM 800, the DSP 924, or other components 926. As a second example, the baseband sub-system 906 may be connected to a user interface processor 908 that may facilitate input and output of voice and/or data provided to and/or received from the user.

The baseband sub-system 906 can also be connected to a memory 910 that may be configured to store data and/or instructions to facilitate the operation of the wireless device 900, and/or to provide storage of information for the user. Further, in some embodiments, the memory 910 may include an average power tracking (APT) table, or other data structure. The APT table can identify target voltage levels for the PA 102 that correspond to target power levels, which may be identified by a base station. For example, upon receipt of a target power level from a base station, the wireless device may access the APT table to determine a corresponding target voltage level. This target voltage level may be used to set an operating point for the PA 102. Further, the APT table may include different target voltage levels based on the operating class of the PA 102 and/or the desired communication band.

In some embodiments, the call processor 918 may be in communication with the base station. This call processor 918 may interpret commands from the base station and may access the APT table based on a command received from the base station. Further, the call processor 918 may instruct the PAM 800 to adjust the operating point of the PA 102. Moreover, the call processor 918 may instruct the controller 806 to configure the PA 102 to operate in a particular class, such as class E, class F, or inverse class F, and so forth. Configuring the operation of the PA 102 may include configuring the programmable harmonic termination circuits 804. In addition, the call processor 918 may instruct the controller 806 to configure the PA 102 to process signals within a particular frequency band.

In addition to the aforementioned components, the wireless device 900 may include one or more central processors 920. Each central processor 920 may include one or more processor cores. Further, the wireless device 900 may include one or more antennas 902A, 902B. In some cases, one or more of the antennas of the wireless device 400 may be configured to transmit and/or receive at different frequencies or within different frequency ranges. Further, one or more of the antennas may be configured to work with different wireless networks. Thus, for example, the antenna 902A may be configured to transmit and receive signals over a 2G network, and the antenna 902B may be configured to transmit and receive signals over a 3G or 4G LTE network. In some cases, the antennas 902A and 902B may both be configured to transmit and receive signals over, for example, a 2.5G network, but at different frequencies.

In some implementations, each antenna may be in electrical communication with the PAM 800 and/or the power amplification system 930. Alternatively, or in addition, each antenna may be associated with or in electrical communication with a different PAM or power amplification system. Thus, while the antenna 902A is in electrical communication with the power amplification system 930, the antenna 902B may be in electrical communication with another power amplification system (not shown). Moreover, in certain embodiments, the antenna 902A may be a primary antenna and the antenna 902B may be a diversity antenna, or vice versa.

A number of other wireless device configurations can utilize one or more features described herein. For example, a wireless device does not need to be a multi-band device. In another example, a wireless device can include additional antennas such as a diversity antenna, and additional connectivity features such as Wi-Fi, Bluetooth, and GPS. Further, the wireless device 900 may include any number of additional components 926, such as analog to digital converters, digital to analog converters, graphics processing units, solid state drives, etc. Moreover, the wireless device 900 can include any type of device that may communicate over one or more wireless networks and that may include a PA 102 and/or PAM 800. For example, the wireless device 900 may be a cellular phone, including a smartphone or a dumbphone, a tablet, a laptop, a video game device, a smart appliance, etc.

Example Power Amplifier Class Selection Process

Figure 10:
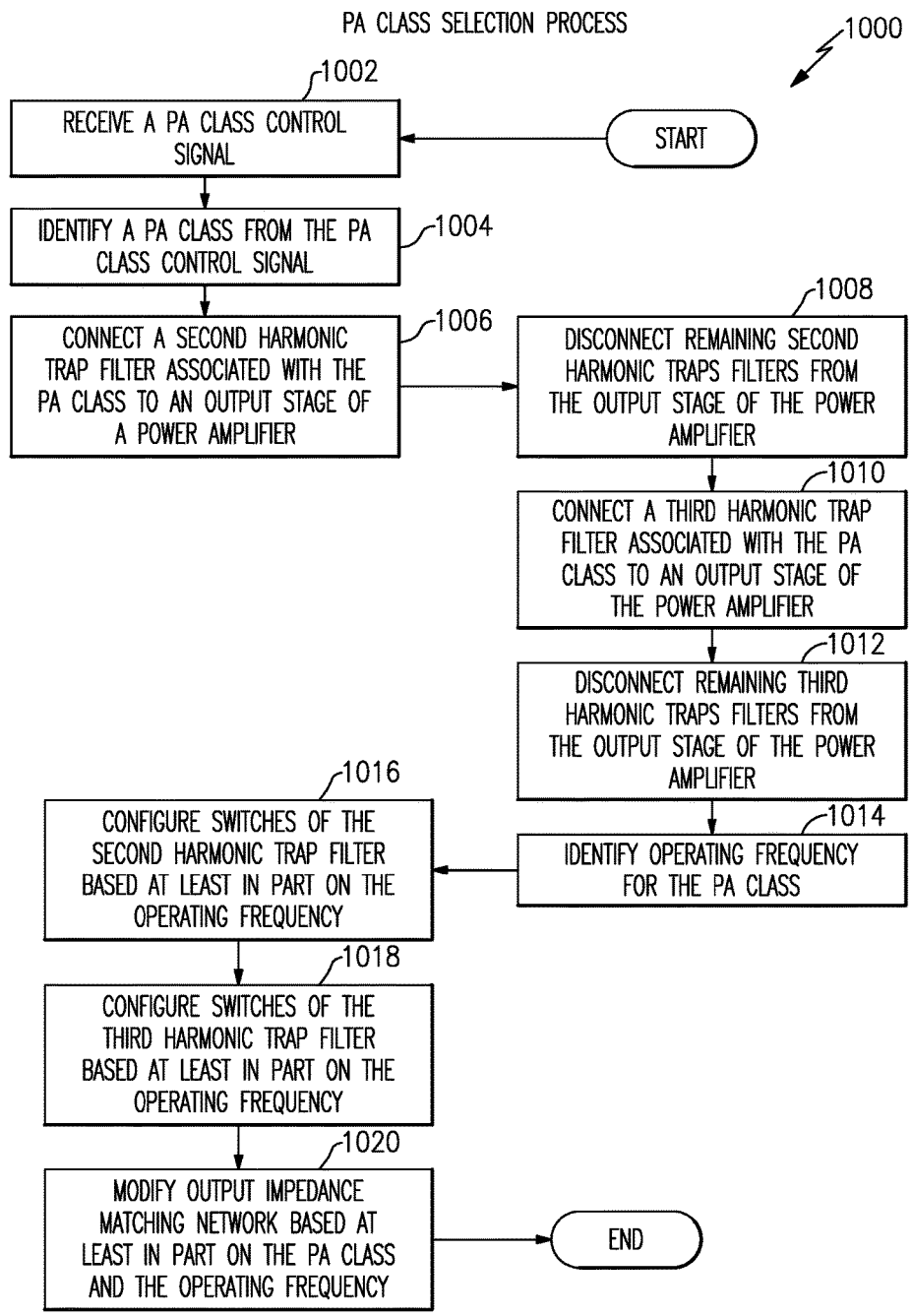
FIG. 10 is a flowchart of one example of a power amplifier class selection process.

FIG. 10 is a flowchart of one example of a power amplifier class selection process 1000. It should be understood that the process 1000 is one example of a process for selecting and/or configuring a class of operation for a power amplifier, such as the power amplifier 102. Other processes for selecting and/or configuring the class of operation of the power amplifier are possible. For example, operations of the process 1000 may be performed in a different order or substantially in parallel. Thus, the order of the operations described with respect to the process 1000 is for ease of description and not to limit the process 1000. Moreover, it should be understood that a variety of systems, including a variety of hardware, software, firmware, or a combination thereof can implement at least portions of the process 1000. For example, the process 1000 may be performed, at least in part, by the controller 806, the programmable harmonic termination circuits controller 814, the PA bias controller 810, or the PA class controller 812, combinations of the same, and so forth. To simplify discussion and not to limit the present disclosure, the process 1000 will be described with respect to particular systems.

The process 1000 may begin when, for example, the PA class controller 812 receives a PA class control signal at block 1002. This PA class control signal may be received from a core processor 918 and/or may be accessed from a memory 910. Alternatively, the PA class controller 812 may generate the PA class control signal based at least in part on information or configuration data accessed from the memory 910, received from the call processor 918, or received from a base station. In some cases, the PA class control signal may include configuration information provided by a manufacturer of the wireless device 900 and/or from a base station.

At block 1004, the PA class controller 812 identifies a PA class based at least in part on the PA class control signal received at block 1002. At block 1006, the PA class controller 812 connects a second harmonic trap filter associated with the PA class identified at the block 1004 to an output stage 104 of the power amplifier 102. In some implementations, the second harmonic trap filter may be one of a plurality of second harmonic trap filters. At least some of the plurality of second harmonic trap filters may be associated with a different operational class for the power amplifier 102. For example, one second harmonic trap filter may be associated with a class F power amplifier and another second harmonic trap filter may be associated with an inverse class F power amplifier.

At block 1008, the PA class controller 812 disconnects remaining second harmonic trap filters from the output stage 104 of the power amplifier 102. In some embodiments, the block 1008 may be optional or omitted. For example, in cases where the remaining harmonic trap filters are already disconnected from the power amplifier 102, the block 1008 is omitted.

At block 1010, the PA class controller 812 connects a third harmonic trap filter associated with the PA class identified at the block 1004 to an output stage 104 of the power amplifier 102. In some implementations, the third harmonic trap filter may be one of a plurality of third harmonic trap filters. At least some of the plurality of third harmonic trap filters may be associated with a different operational class for the power amplifier 102. For example, one third harmonic trap filter may be associated with a class F power amplifier and another third harmonic trap filter may be associated with a class E power amplifier.

At block 1012, the PA class controller 812 disconnects remaining third harmonic trap filters from the output stage 104 of the power amplifier 102. In some embodiments, the block 1012 may be optional or omitted. For example, in cases where the remaining harmonic trap filters are already disconnected from the power amplifier 102, the block 1012 is omitted.

The function of the harmonic trap filters connected at the block 1006 and 1010 can depend on the class type for the power amplifier 102. In some cases, the second harmonic trap filter connected at the block 1006 can present a short for the second harmonic frequency, or the 2FO frequency. Further, in some such cases, the third harmonic trap filter connected at the block 1010 can present an open impedance for the third harmonic frequency, or the 3FO frequency. For instance, as illustrated in FIG. 5, a class F amplifier may include such a configuration. In other cases, the second harmonic trap filter connected at the block 1006 can present an open impedance for the second harmonic frequency, or the 2FO frequency. Further, in some such cases, the third harmonic trap filter connected at the block 1010 can present a short for the third harmonic frequency, or the 3FO frequency. For instance, as illustrated in FIG. 5, an inverse class F amplifier may include such a configuration.

In certain embodiments, harmonic trap filters may be connected to the output stage 104 of the power amplifier 102 for additional harmonics of a received signal, such as a fourth harmonic, fifth harmonic, and so forth. However, in other cases, the harmonic trap filters are used only for the second harmonic in the third harmonic of the received signal.

In some implementations, additional harmonic trap filters may be included as inter-stage switched harmonic terminations 110. As illustrated, for example, in FIG. 1, the additional inter-stage switched harmonic terminations 110 may be in electrical communication with a base of the output transistor 104. Typically, the inter-stage harmonic trap filters are not included as part of additional stages of the power amplifier 102 because, generally, the gain of the received signal is too small to benefit substantially from including an inter-stage harmonic trap filter at an earlier stage of the power amplifier 102. However, in certain embodiments, additional inter-stage harmonic trap filters may be included as part of power amplifier 102. For example, in a three stage are for stage multistage power amplifier, an inter-stage harmonic trap filter may be included before the output stage and before the second to last transistor stage.

At block 1014, the programmable harmonic termination circuits controller 814 identifies an operating frequency for the power amplifier class. The programmable harmonic termination circuits controller 814 may determine the operating frequency by accessing a manufacturer program to control at the memory 910. Typically, the operating frequency for a particular PA class is static and is based on the manufacture specifications for the wireless device 900. However, in some cases, the operating frequency may be dynamic. For example, in some cases, the operating frequency may differ based on a distance from a base station and/or a command from the base station.

At block 1016, the programmable harmonic termination circuits controller 814 configures one or more switches of the second harmonic trap filter based at least in part on the operating frequency identified at block 1014. By configuring the one or more switches of the second harmonic trap filter, one or more capacitors of the harmonic trap filter may be electrically connected to the collector of the output stage 104 of the power amplifier 102. Further, in some cases, one or more capacitors of a second harmonic inter-stage harmonic trap filter may be electrically connected to the base of the output stage 104 of the power amplifier 102.

At block 1018, the programmable harmonic termination circuits controller 814 configures one or more switches of the third harmonic trap filter based at least in part on the operating frequency identified at block 1014. By configuring the one or more switches of the third harmonic trap filter, one or more capacitors of the harmonic trap filter may be electrically connected to the collector of the output stage 104 of the power amplifier 102. Further, in some cases, one or more capacitors of a third harmonic inter-stage harmonic trap filter may be electrically connected to the base of the output stage 104 of the power amplifier 102.

At block 1020, the controller 806 modifies an output impedance matching network 112 based at least in part on the PA class and the fundamental operating frequency. The fundamental operating frequency may correspond to the harmonic frequencies processed by the harmonic trap filters. In some cases, the PA 102 is a high impedance power amplifier. Thus, in some cases, a smaller impedance transformer is required compared to other power amplifier designs. Moreover, in some cases, and impedance transformer is not necessary. Thus, in some cases, the output impedance matching network 112 may be omitted. Accordingly, in some cases, block 1020 may be optional or omitted. In some such cases, the power amplifier 102 may be electrically connected to a low pass filter.

In certain embodiments, the process 1000 can be used to modify one or more of the class of operation of the PA 102 and the operating frequency of the PA 102. Thus, in certain embodiments, embodiments described herein enable dynamic operation of the wireless device 900 and the PA 102. Often, the class of operation of the PA 102 and the operating frequency will be static during a particular call or during a particular communication time slot with a base station. However, in some cases, the PA 102 may be reconfigured during a call. For example, during hand off between base stations, the PA 102 may be reconfigured to support a different class and/or frequency.

Terminology

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The term "coupled" is used to refer to the connection between two elements, the term refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the inventions are not intended to be exhaustive or to limit the inventions to the precise form disclosed above. While specific embodiments of, and examples for, the inventions are described above for illustrative purposes, various equivalent modifications are possible within the scope of the inventions, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the inventions provided herein can be applied to other systems, not necessarily the system described above. The elements and acts of the various embodiments described above can be combined to provide further embodiments.

Conditional language used herein, such as, among others, "can," "might," "may," "e.g.," and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

Disjunctive language such as the phrase "at least one of X, Y, or Z," unless specifically stated otherwise, is otherwise understood with the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

Unless otherwise explicitly stated, articles such as "a" or "an" should generally be interpreted to include one or more described items. Accordingly, phrases such as "a device configured to" are intended to include one or more recited devices. Such one or more recited devices can also be collectively configured to carry out the stated recitations. For example, "a processor configured to carry out recitations A, B and C" can include a first processor configured to carry out recitation A working in conjunction with a second processor configured to carry out recitations B and C.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A power amplifier module comprising:
   a power amplifier including a first stage and a second stage, the power amplifier configured to receive a signal;

a first programmable harmonic termination circuit located between the first stage and the second stage of the power amplifier, the first programmable harmonic termination circuit including a first plurality of capacitors and a first plurality of switches, at least one of the first plurality of capacitors in electrical communication with at least one of the first plurality of switches; and a controller configured to modify a configuration of the first plurality of switches of the first programmable harmonic termination circuit based at least in part on a second harmonic frequency of the signal.

2. The power amplifier module of claim 1 further comprising a second programmable harmonic termination circuit in electrical communication with an output stage of the power amplifier, the second programmable harmonic termination circuit including a second plurality of capacitors and a second plurality of switches.

3. The power amplifier module of claim 2 wherein at least one of the second plurality of capacitors is in electrical communication with at least one of the second plurality of switches, the controller further configured to modify a configuration of the second plurality of switches of the second programmable harmonic termination circuit based at least in part on a third harmonic frequency of the signal.

4. The power amplifier module of claim 3 wherein, in response to a control signal associated with class F operation, the controller is further configured to modify the configuration of the first plurality of switches of the first programmable harmonic termination circuit to short the second harmonic frequency of the signal and to modify the configuration of the second plurality of switches of the second programmable harmonic termination circuit to present an open impedance to the third harmonic frequency of the signal.

5. The power amplifier module of claim 3 wherein, in response to a control signal associated with inverse class F operation, the controller is further configured to modify the configuration of the first plurality of switches of the first programmable harmonic termination circuit to present an open impedance to the second harmonic frequency of the signal and to modify the configuration of the second plurality of switches of the second programmable harmonic termination circuit to short the third harmonic frequency of the signal.

6. The power amplifier module of claim 1 wherein the controller is further configured to modify the configuration of the first plurality of switches of the first programmable harmonic termination circuit based at least in part on a selected operational class of the power amplifier.

7. The power amplifier module of claim 1 wherein the power amplifier supports multiple configurations.

8. The power amplifier module of claim 5 wherein the power amplifier supports at least two of class F configuration, inverse class F configuration, class E configuration, or class J configuration.

9. The power amplifier module of claim 2 further comprising an output impedance matching network in electrical communication with the output stage of the power amplifier.

10. The power amplifier module of claim 2 further comprising a low-pass filter in electrical communication with the output stage of the power amplifier.

11. The power amplifier module of claim 2 wherein the power amplifier module does not include an output impedance matching network in electrical communication with the output stage of the power amplifier.

12. A wireless device comprising:
a plurality of load lines, at least some of the load lines corresponding to a different communication frequency band;
a switch network configured to electrically connect a load line from the plurality of load lines to a power amplifier; and
a power amplifier module including the power amplifier, a first programmable harmonic termination circuit in electrical communication with an output stage of the power amplifier, and a controller, the power amplifier configured to receive a signal, the first programmable harmonic termination circuit including a first plurality of capacitors and a first plurality of switches, at least one of the first plurality of capacitors in electrical communication with at least one of the first plurality of switches, and the controller configured to modify a configuration of the first plurality of switches of the first programmable harmonic termination circuit based at least in part on a second harmonic frequency of the signal.

13. The wireless device of claim 12 wherein the power amplifier module further includes a second programmable harmonic termination circuit in electrical communication with the output stage of the power amplifier, the second programmable harmonic termination circuit including a second plurality of capacitors and a second plurality of switches.

14. The wireless device of claim 12 wherein at least one of the second plurality of capacitors is in electrical communication with at least one of the second plurality of switches, the controller further configured to modify a configuration of the second plurality of switches of the second programmable harmonic termination circuit based at least in part on a third harmonic frequency of the signal.

15. The wireless device of claim 12 wherein the power amplifier supports multiple operational classes.

16. A power amplifier module comprising:
a multistage power amplifier including at least a first stage and a second stage, the multistage power amplifier configured to receive a signal;
an inter-stage programmable harmonic termination circuit located between the first stage and the second stage, the inter-stage programmable harmonic termination circuit including a plurality of capacitors and a plurality of switches, at least one of the plurality of capacitors in electrical communication with at least one of the plurality of switches; and
a controller configured to modify a configuration of the plurality of switches of the inter-stage programmable harmonic termination circuit based at least in part on a harmonic frequency of the signal.

17. The power amplifier module of claim 16 wherein the second stage is an output stage of the power amplifier.

18. The power amplifier module of claim 16 wherein the harmonic frequency of the signal is one of a second harmonic frequency or a third harmonic frequency.

19. The power amplifier module of claim 18 wherein the controller is further configured to modify the configuration of the plurality of switches with respect to one of the second harmonic frequency or the third harmonic frequency based at least in part on a particular class of operation of the multistage power amplifier.

20. The power amplifier module of claim 19 wherein the particular class of operation of the amplifier corresponds to a communication frequency band from a plurality of communication frequency bands supported by the multistage power amplifier.

\* \* \* \* \*